United States Patent [19]

Dooley

[11] Patent Number: 4,795,965
[45] Date of Patent: Jan. 3, 1989

[54] CAPACITANCE TO VOLTAGE CONVERSION CIRCUIT INCLUDING A CAPACITIVE BRIDGE AND A CAPACITIVE OFFSET

[75] Inventor: Kevin A. Dooley, Georgetown, Canada

[73] Assignee: Pratt & Whitney Canada Inc., Longueuil, Canada

[21] Appl. No.: 108,124

[22] Filed: Oct. 14, 1987

[51] Int. Cl.⁴ .................... G01R 17/02; G01R 17/10; G01R 27/26

[52] U.S. Cl. ................................. 324/60 C; 324/61 R; 324/DIG. 1; 324/98

[58] Field of Search .................. 324/61 R, DIG. 1, 98, 324/98 R, 60 C, 457, 458; 73/718, 724; 318/662; 340/870.37

[56] References Cited

U.S. PATENT DOCUMENTS

| | | | |
|---|---|---|---|
| 3,760,254 | 9/1973 | Hardway, Jr. | 318/662 |
| 4,163,994 | 8/1979 | Sakamoto et al. | 324/61 P X |
| 4,393,710 | 7/1983 | Bernard | 318/662 X |
| 4,584,885 | 4/1986 | Cadwell | 340/870.37 X |

*Primary Examiner*—Reinhard J. Eisenzopf
*Assistant Examiner*—Jack B. Harvey
*Attorney, Agent, or Firm*—Foley & Lardner, Schwartz, Jeffery, Schwaab, Mack, Blumenthal & Evans

[57] ABSTRACT

A capacitance to voltage conversion circuit for converting changes in capacitance of a capacitive bridge-type probe to voltage includes a detector for detecting changes in an excitation signal across a sensitive arm of the probe due to changes in capacitance of the sensitive arm. A variable gain amplifier having a gain control amplifies the output of the detector. The output of the amplifier is fed to a synchronous detector, and the output of the synchronous detector is fed to a comparator whose other input is fed from a source of reference voltage. An offset circuit provides a predetermined imbalance to the bridge, and a switching circuit are provided for switching the offset circuit in the sensitive arm. Both the synchronous detector and the offset circuit are clocked by a reference oscillator. Thus, when the offset circuit is in cirucit, the first synchronous detector is clocked so that the output of the variable gain amplifier due to the offset is compared, in the comparator, with the output of the source of reference voltage. The gain of the variable gain amplifier is controlled to drive the output of the synchronous detector to be equal to the output of the source of reference voltage.

7 Claims, 3 Drawing Sheets

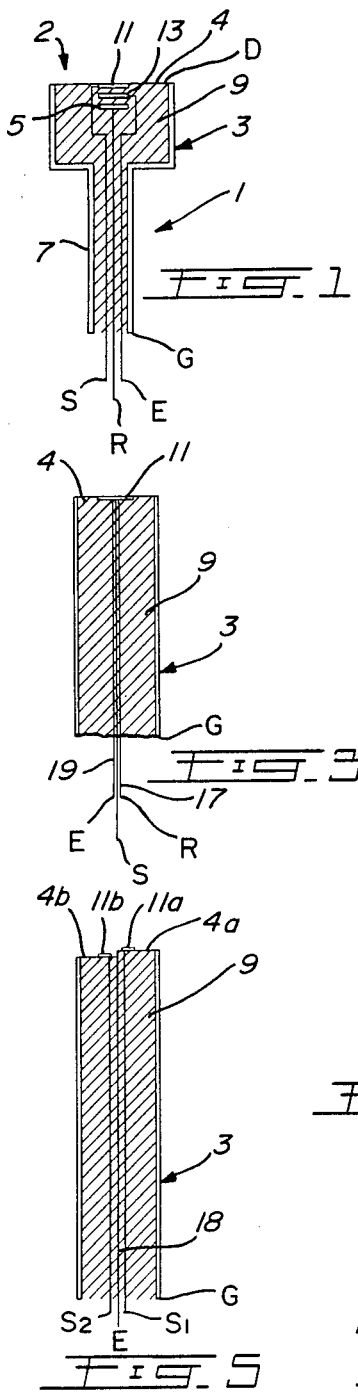
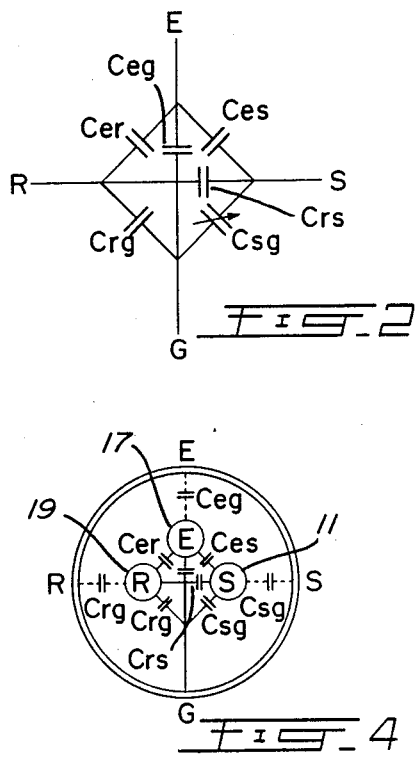
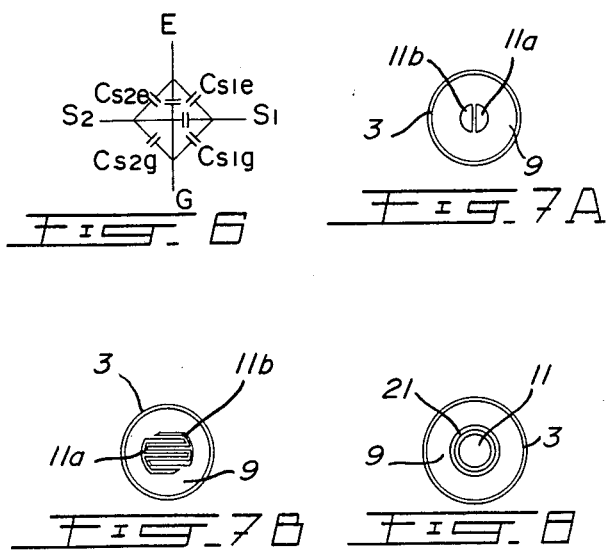

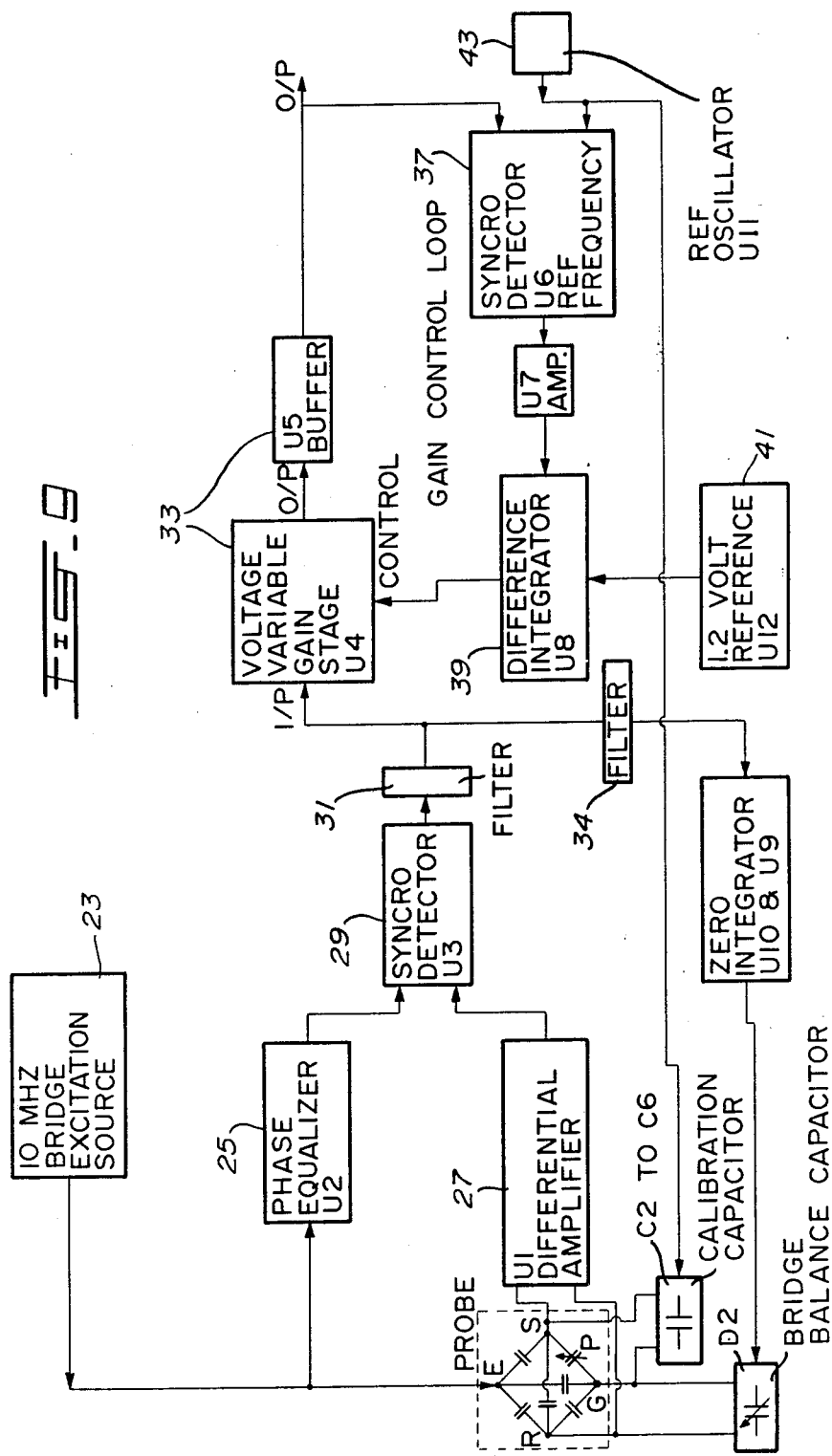

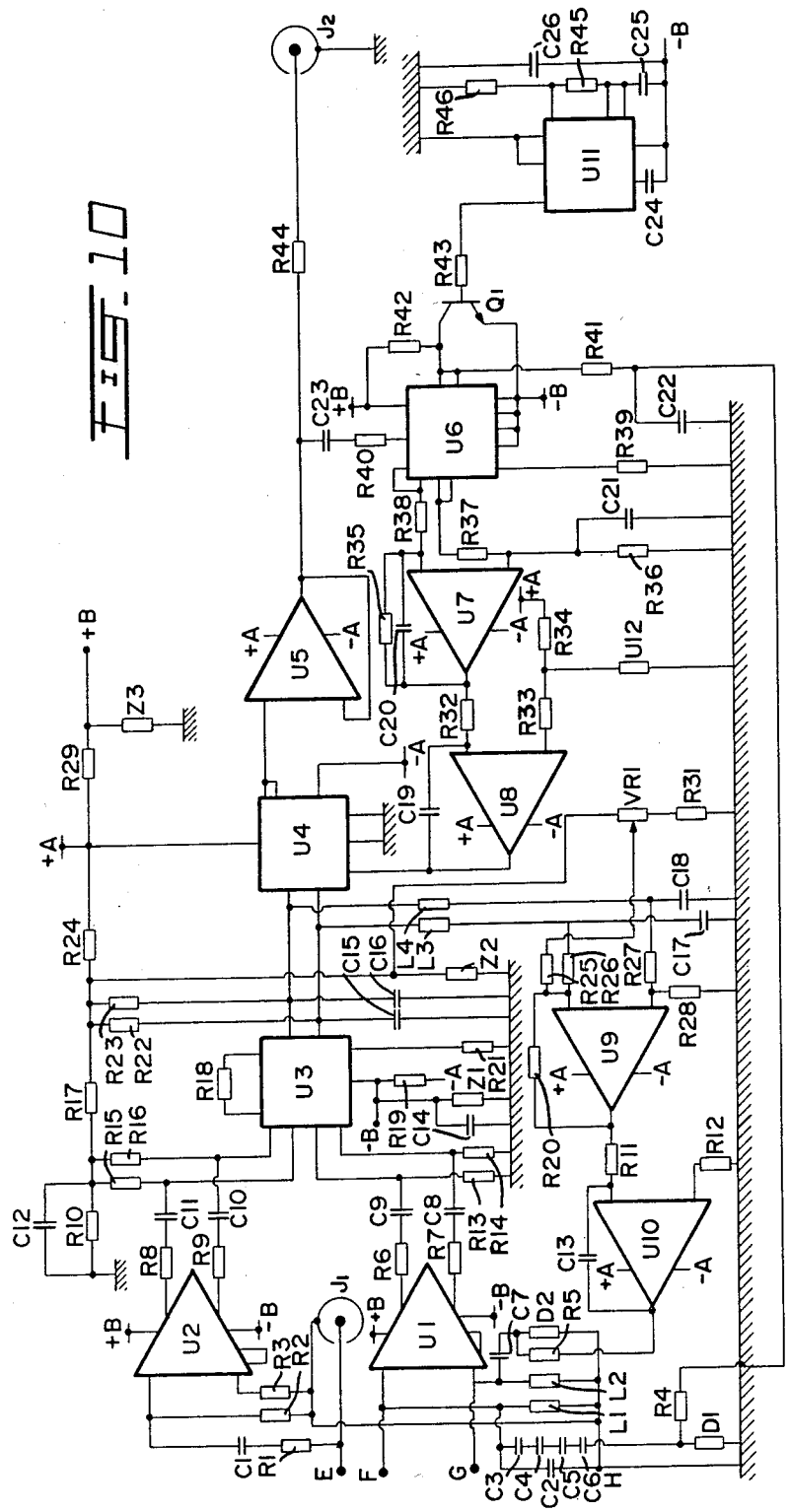

CAPACITANCE TO VOLTAGE CONVERSION CIRCUIT INCLUDING A CAPACITIVE BRIDGE AND A CAPACITIVE OFFSET

BACKGROUND OF INVENTION

1. Field of the Invention

The invention relates to a capacitive bridge-type probe for measuring clearance between a fixed surface and a member movable relative to said fixed surface. More specifically, the invention relates to a probe for measuring the clearance between the tip of a movable turbine blade and the inner surface of the turbine shroud.

The invention also relates to a capacitance to voltage conversion circuit for converting changes in capacitance of the capacitive bridge-type probe to a voltage. More specifically, the invention relates to such a conversion circuit which uses offset means for providing a predetermined imbalance to the bridge whereby to provide automatic calibration of the circuit.

2. Description of Prior Art

It is known in the art to use full bridge techniques for measurement of extremely small changes in relatively large quantities. A prime example of such a bridge is the strain gauge bridge. An advantage of the full bridge techniques, when properly constructed, is their inherent stability over a wide range of environmental temperature ranges. If all elements of the bridge are identical, the bridge will remain in a balanced condition over a wide temperature range which does not destroy the base properties of the materials making up the arms of the bridge. Obviously, variations will occur in each of the individual arms of the bridge as a function of temperature. However, if the arms possess identical properties, the electrical balance of the bridge will be maintained as each arm will vary by the same amount.

Thus, any electrical imbalance occurring will be purely as a result of differential changes of the arms deliberately induced by effects of the quantity to be measured. As such, bridge imbalance is a measure of a specific quantity, for example, blade top clearance.

Full capacitive bridges are also known in the art. The present application does not relate to the idea of capacitive bridge per se, but rather, to a particular structure for a probe comprising a capacitive bridge type probe.

Electronic circuitry, for converting the change in a bridge parameter (e.g. change in a resistance-type bridge or change in capacitance in a capacitance-type bridge) are also known in the art. However, we are not aware of any such circuitry which is both sensitive only to changes in the parameter and also includes automatic calibration.

SUMMARY OF INVENTION

It is therefore an object of the invention to provide a capacitive bridge-type probe.

It is more specifically an object of the invention to provide a structure for such a probe which is particularly suitable for use in measuring the clearance between a fixed surface and a member movable relative to the fixed surface.

It is a further object of the invention to provide an electronic circuit for converting changes in the bridge-type probe to an electronic signal.

In accordance with the invention, there is provided a capacitive bridge-type probe for measuring clearance between a fixed surface and a member movable to the fixed surface. The probe includes an elongated conductive casing having an opening in one end thereof and a dielectric material filling the casing. The dielectric material forms a surface across the opening of the casing at the one end, and a first plate member is disposed on the surface parallel therewith. A first conductive lead extends from the first plate member longitudinally of the casing and out the other end of the casing. One sensitive arm of the probe is formed by the capacitance between the plate member and the casing, and the probe is mounted in the fixed suface such that the plate member of the sensitive arm faces the movable member. Thus, the character and magnitude of the dielectric medium between the plate member and the casing is sensitive to and variable with a change in clearance between the fixed surface and the movable member so that the capacitance of the sensitive arm is sensitive to and variable with a change in clearance between the fixed surface and the movable member.

Also in accordance with the invention, a capacitance to voltage conversion circuit for converting changes in capacitance of a capacitive bridge-type probe to voltage includes detector means for detecting changes in an excitation signal across a sensitive arm of the probe due to changes in capacitance of the sensitive arm. A variable gain amplifier having a gain control amplifies the output of the detector means. The output of the amplifier is fed to a synchronous detector, and the output of the synchronous detector is fed to a comparator whose other input is fed from a source of reference voltage. Offset means are provided for providing a predetermined imbalance to the bridge, and means are provided for switching the offset means in circuit in the sensitive arm. Both the synchronous detector and the offset means are clocked by a reference oscillator. Thus, when the offset means is in circuit, the first synchronous detector is clocked so that the output of the variable gain amplifier due to the offset is compared, in the comparator means, with the output of the source of reference voltage. The gain of the variable gain amplifier is controlled to drive the output of the synchronous detector to be equal to the output of the source of reference voltage.

BRIEF DESCRIPTION OF DRAWINGS

The invention will be better understood by an examination of the following description, together with the accompanying drawings, in which:

FIG. 1 illustrates one embodiment of a capacitive bridge probe in accordance with the invention;

FIG. 2 is the electrical equivalent of the embodiment of FIG. 1;

FIG. 3 illustrates a second embodiment of the capacitive bridge probe;

FIG. 4 is an electrical and physical equivalent of the embodiment of FIG. 3;

FIG. 5 illustrates still a further embodiment of the capacitive bridge probe in accordance with the invention;

FIG. 6 is the electrical equivalent of FIG. 5;

FIGS. 7A and 7B show different plate structures which can be used in the embodiment of FIG. 5;

FIG. 8 illustrates still a further embodiment of a capacitive bridge probe in accordance with the invention;

FIG. 9 is a block diagram of a capacitive to voltage converter in accordance with the invention; and FIG. 10 is a schematic diagram of the capacitive to voltage converter.

DESCRIPTION OF PREFERRED EMBODIMENTS

Referring to FIG. 1, a capacitive bridge probe structure is illustrated generally at 1 and comprises an elongated conductive casing 3, having an opening 2 at one end thereof, which is preferably cylindrical in shape but may be, for example, of square, rectangular or irregularly shape in cross-section. In the FIG. 1 embodiment, the casing comprises a large diameter cylinder 5 and a small diameter cylinder 7. However, as will be seen in further embodiments, it is possible that the casing be a single diameter cylinder.

The casing is filled with a dielectric material 9 (e.g. alumina) along the entire length thereof, the dielectric material having a surface 4 at the one end 2 of the casing.

Parallel plates 11, 13 and 15 are embedded in the dielectric material. The plates comprise a conductive material and, as can be seen, the plate 11, which is the sensitive plate, extends across and is parallel to the surface 4.

Referring to FIG. 2, the probe forms the four capacitive arms of a capacitive bridge. The capacitance $C_{ER}$ is the capacitance between plates 13 and 15. This capacitance is, of course, fixed in that the distance between plates 13 and 15 is fixed as is the dielectric magnitude between the plates.

In a like manner, capacitance $C_{ES}$ is the fixed capacitance between plates 13 and 11, and $C_{RG}$ is the fixed capacitance between the plate 15 and the casing 3.

$C_{SG}$ is the capacitance between the plate 11 and the casing 3. In use, when measuring the clearance between a fixed surface and a moving part (e.g. the distance between the tip of a turine blade and the shroud covering the turbine), the capacitance probe is mounted in the shroud, which is fixed relative to the turbine blade, such that the top surface 4 faces the moving blade. Accordingly, the capacitance $C_{SG}$ will be variable, in that the nature and magnitude of the dielectric medium between the top plate 11 and the casing 3 will vary with the clearance of the moving member (turbine blade tip) and the fixed surface (the inner surface of the shroud). Thus, if the bridge is balanced for a predetermined magnitude of clearance, any deviation from this clearance will cause an imbalance of the bridge.

As can be seen in FIG. 1, conductive leads extend from each plate 11, 13 and 15 longitudinally of the casing and out the other end of the casing.

In the FIG. 3 embodiment, the casing 3 comprises a single diameter cylinder. The casing is once again filled with a dielectric material 9 which has a surface 4. Plate 11 once again extends across the surface and is parallel thereto. However, in this embodiment, plates 13 and 15 are eliminated, and capacitances are formed between the plate 11, the casing 3, and conductors 17 and 19 which are parallel to the conductive lead extending from plate 11. Referring to FIG. 4, $C_{ER}$ is the capacitance between conductors 19 and 17, $C_{RG}$ is the capacitance between conductor 17 and casing 3, $C_{ES}$ is the capacitance between conductor 19 and plate 11, and $C_{SG}$ is the capacitance between plate 11 and casing 3. Once again, $D_{SG}$ is variable for the same reasons as in the FIG. 1 embodiment.

The FIG. 5 embodiment is similar to the FIG. 3 embodiment except that the surface 4 is split into two levels 4a and 4b. The plate 11 is similarly split into two plates 11a and 11b, and plate 11a extends across surface 4a whereas plate 11b extends across surface 4b. As is clearly seen in FIG. 5, surfaces 4a and 4b are parallel to each other as are plates 11a and 11b.

Referring to FIG. 6, the fixed capacitances $C_{S1E}$ and $C_{S2E}$ are the capacitances formed between the plate 11a and conductor 18 and the plate 11b and conductor 18, respectively. $C_{S1G}$ and $C_{S2G}$ are variable capacitances formed between the plates 11a and the casing 3 and the plate 11b and the casing 3, respectively. As plates 11a and 11b are at different distances from the moving member, e.g., the tip of the turbine blade, the capacitance $C_{S1G}$ is always different from the capacitance $C_{S2G}$, and these capacitances are different from each other by a known amount in that the distance between the plates 11a and 11b is known.

The advantage of the latter configuration is as follows:

The relationship between capacitance and distance or clearance (of the sensitive plate from the moving member) is non-linear. I.e., there exists the relationship $C \alpha K/D$. By substituting into this relationship the voltage difference, i.e., the difference in voltage $(\Delta V) \alpha \Delta C$ which appears across $C_{S1G}$ and $C_{S2G}$, and by appropriate calibration, a linear relationship is achieved, i.e., $$\text{clearance} \propto \frac{K \cdot \Delta V}{V \propto (C_{S1G} + C_{S2G})}$$

where K=constant of proportionality.

FIG. 7A illustrates one shape for the top surface of the plates 11a and 11b. As shown in FIG. 7A, the two plates are adjacent each other and are each in the form of a half-moon.

FIG. 7B illustrates an alternate arrangement for the plates 11a and 11b. As can be seen, the plates 11a and 11b in FIG. 7B comprise intertwined fingers.

In FIG. 8, there is the sensitive plate 11 which is surrounded by a second sensitive plate 21 which would be connected to a separate lead. The purpose of the plate 21 is to signal the arrival of the moving member. Specifically, the capacitance between the plate 21 and the casing would be changed before the capacitance between the plate 11 and the casing would be changed.

After the movable member has passed, the capacitance between plate 21 and casing 3 will change after the capacitance between plate 11 and the casing 3 has changed. Thus, the surrounding plate 21 can provide an envelope for synchronous detection.

Turning now to a circuit for processing the output of the probe, attention is directed to FIGS. 9 and 10. It is first pointed out that the casing of the probe is grounded so that the terminal G in FIG. 1 is at common potential. The same reference letters used in FIG. 1 for the probe are also being used in FIGS. 9 and 10.

As seen in FIG. 9, the excitation terminal E is fed from a source of excitation 23 which can comprise a 10 MHz oscillator. The output of source 23 is also fed to a phase equalizer 25 for reasons which will be explained below. The phase equalizer is implemented by amplifier U2 and related circuitry in FIG. 10. In this regard, it is noted that in FIG. 10 the excitation source 23 is not illustrated. Instead, FIG. 10 illustrates a jack $J_1$ which would be connected to an excitation source. $J_1$ is also connected to the terminal E as well as to an input of U2.

Terminals S and R of the probe are connected to respective inputs of a differential amplifier 27. As seen in FIG. 10, the differential amplifier is implemented by amplifier U1 along with associated circuitry.

As is well known, when the signal passes through the differential amplifier 27, it will experience a phase shaft. Phase equalizer 25 is provided for the purpose of providing the same phase shift to the signal from the excitation source 23. Thus, both inputs to synch detector 29, that is, the input from phase equalizer 25 and differential amplifier 27, are in phase.

The phase equalizer 25 and the differential amplifier 27 and the synchronous detector 29 constitute a detector means in the system.

When the excitation source is a 10 MHz source, the differential output of 27 is a 10 MHz sine voltage which is proportional to the bridge imbalance, i.e., with zero imbalance, the output is zero volts.

The synchronous detector 29 is implemented, as seen in FIG. 10 by balanced modulator U3. The output of the balanced modulator U3 is the product of its two input signals. The amplitude of the upper port (provided directly from the excitation source 23) is fixed so that the output voltage of U3 is proportional to the output of the differential amplifier 27. As the output of the amplifier 27 is, as above-described, a function of probe imbalance, the output of the synchronous detector 29 is also a function of probe imbalance.

Since the two inputs to the synchronous detector 29 are matched in both phase and frequency, the output of synchronous detector 29 is a D.C. voltage with a 20 MHz signal superimposed. This output is passed through filter 31 (implemented in FIG. 10 by capacitors C15 and C16) to filter out the 20 MHz component. Thus, the output of the filter 31 is a D.C. voltage which is proportional to bridge imbalance.

The D.C. output is routed via a variable gain amplifier, specifically voltage variable gain stage 33, which is implemented in FIG. 10 by a multiplier U4 and a buffer U5, to the output, implemented in FIG. 10 by jack J2, and to a sychro detector 37, implemented in FIG. 10 by auto gain circuit U6. The output of 37 is fed to a comparator which is shown in FIG. 9 as a difference integrator 39 whose other input is fed from a source of reference voltage 41. In FIG. 10, the difference integrator 39 is implemented by amplifier U8, and the output of U6 is fed to U8 through an amplifier U7. The source of reference voltage 41 is illustrated schematically in FIG. 10 at U12.

The synchronous detector 37 is clocked by the reference oscillator 43, which is implemented in FIG. 10 by oscillator U11. Oscillator U11 also provides a clocking signal to offset means 45 for providing a predetermined imbalance to the bridge. As seen in FIG. 10, the offset means 45 comprises a bank of capacitors C2 and C3 to C6, along with a diode D1. When the diode D1 is shorted (forward biased), then the capacitor bank is in circuit between terminals S and G, that is, in the sensitive arm of the bridge. Thus, a known offset capacitance is added to the sensitive arm of the bridge whenever the diode D1 is shorted (forward biased). As this shunt capacitance is essentially switched in and out by D1, the bridge is sequentially imbalanced and balanced by a well defined and known amount of capacitance. This results in a square wave output from voltage variable gain phase 33 (U5) which is proportional to the known shunt capacitance across an unknown bridge capacitance excited at an unknown excitation level.

The amplitude of the square wave is synchronously detected in synchronous detector 37 (U6), and the output of the synchronous detector 37 is compared to a stable reference voltage from source 41 in difference integrator 39 (U8). The integrated error voltage is used to adjust the gain of the analog multiplier U4 (voltage variable gain stage 33) in such a way as to force the output of amplifier U7 (synchro detector 37) to be equal to the reference voltage at all times. This action results in fixing the sensitivity of the overall system (including the probe) to a given sensitivity of V/PF (volts per picofarad). Thus, changes in net bridge capacitance, excitation voltage or circuit gain are automatically compensated out. Thus, there is provided in the novel circuit an automatic sensitivity calibration arrangement, which, although illustrated herein in a particular circuit, may be applicable to other types of transducer instrumentation systems.

The output of filter 31 is also fed to an automatic bridge balance arrangement comprising a zero integrator 35 and a bridge balance capacitor arrangement 47. As seen in FIG. 10, the zero integrator is implemented by amplifiers U9 and U10, and the bridge balance capacitor arrangement comprises a variable capacitor diode D2. The diode D2 is permanently in circuit between terminals R and G, and the magnitude of the capacitance of the diode D2 is determined by the output of amplifier U10 (zero integrator 35).

The output of 31 is low pass filtered by filter 34 which, in FIG. 10 is implemented by inductors L3 and L4 and capacitors C17 and C18. The filtered signal is amplified in amplifier U9 and integrated in amplifier U10. The output of U10 is then used to adjust the voltage variable capacitor diode D2. This will adjust for any imbalances in the bridge so that D.C. voltage outputs from U3 (synchronous detector 29) will be forced to zero by the balancing action of D2. In normal use, a turbine blade passing the sensitive plate of the probe causes a transient type imbalance of the bridge the duration of which is typically less than 10 microseconds—and depends on blade thickness and velocity. The auto balance circuit will, of course, not react to balance out this signal because component values of the auto balance circuit are chosen such as to cause a slow response in this circuit. Thus, the auto balance circuit operates only on relatively long term imbalances which may occur, such that these do not cause saturation of U1 or D.C. voltage offsets at the output of the circuit (J2) which are also undesirable.

Although the illustrated circuit can be made with partial bridge configuration by making some minor modifications, the circuit is preferably used in conjunction with a full bridge probe.

An advantage of the system of the full bridge probe with the illustrated circuit is the extremely high sensitivity which can be maintained while maintaining stability and wide bandwidth. Lab tests on the system have shown sensitivity to changes of less than $1 \times 10^{-16}$ farad at bandwidths of 1 MHz. This combined high sensitivity and wide bandwidth permits the use of a very small sensitive plate which in turn both reduces the overall size of the probe and improves the accuracy. A pin point sensitive plate would be the ultimate size because the measurement point on a surface would be well defined and the capacitance between the objects would be independent of the object area (assuming the target area is larger than the pin point sensitive plate).

In a particular arrangement, the specifications for the parts illustrated in FIG. 10 are as follows:

| DESIGNATION SPECIFICATION | | | | | |
|---|---|---|---|---|---|
| RESISTORS | | | | | |
| R 1 | 4.7K | R 17 | 1K | R 32 | 33K |
| R 2 | 100 Ω | R 18 | 120 Ω | R 33 | 33K |
| R 3 | 100 Ω | R 19 | 100 Ω | R 34 | 10K |
| R 4 | 100K | R 20 | 47K | R 35 | 1 M Ω |
| R 5 | 10K | R 21 | 6.8K | R 36 | 1 M Ω |
| R 6 | 1K | R 22 | 3.9K | R 37 | 27K |
| R 7 | 1K | R 23 | 3.9K | R 38 | 27K |
| R 8 | 10K | R 24 | 180 Ω | R 39 | 100 Ω |
| R 9 | 10K | R 25 | 1 M Ω | R 40 | 100 Ω |
| R 10 | 1K | R 26 | 47K | R 41 | 27K |
| R 11 | 680K | R 27 | 47K | R 42 | 27K |
| R 12 | 680K | R 28 | 47K | R 43 | 27K |
| R 13 | 1K | R 29 | 100 Ω | R 44 | 47 Ω |
| R 14 | 1K | R 30 | — | R 45 | 470K |
| R 15 | 1K | R 31 | 4.7K | R 46 | 4.7K |
| R 16 | 1K | | | | |
| CAPACITORS | | | | | |
| C 1 | .01 μf | C 10 | .01 μf | C 19 | .47 μf |
| C 2 | 5 pF | C 11 | .01 μf | C 20 | .1 μf |
| C 3 | 2.2 pF | C 12 | 1.0 μf | C 21 | .1 |
| C 4 | 2.2 pF | C 13 | 1.0 | C 22 | .01 |
| C 5 | 2.2 pF | C 14 | .1 | C 23 | 47 μf |
| C 6 | 2.2 pF | C 15 | 180 pF | C 24 | .1 μf |
| C 7 | 27 pF | C 16 | 180 pF | C 25 | .02 μf |
| C 8 | .01 μf | C 17 | 100 pF | C 26 | 47 μf |
| C 9 | .01 μf | C 18 | 100 pF | C 27 | 47 μf |
| INDUCTORS | | | | | |
| L 1 | 100 μH | L 4 | 1 MH | | |
| L 2 | 100 μH | L 5 | 100 μH | | |
| L 3 | 1 MH | L 6 | 100 μH | | |
| DIODES | | | | | |
| D 1 | MUM110 | | | | |
| D 2 | MV209 | | | | |
| ZENER DIODES | | | | | |
| Z 1 | 1N756A | | | | |
| Z 2 | 1N759A | | | | |
| Z 3 | 1N756A | | | | |
| TRANSISTORS | | | | | |
| Q 1 | 2N2222A | | | | |
| INTEGRATED CIRCUITS | | | | | |
| | | Manufacturer | | | |
| U 1 | LM733 | National | | | |
| U 2 | LM733 | National | | | |
| U 3 | LM1596 | National | | | |
| U 4 | A0534 | Analog Devices | | | |
| U 5 | LM118 | National | | | |
| U 6 | CD4053 | RCA | | | |
| U 7 | OP07 | Precision Monolithic | | | |
| U 8 | OP07 | Precision Monolithic | | | |
| U 9 | OP07 | Precision Monolithic | | | |
| U 10 | OP07 | Precision Monolithic | | | |
| U 11 | LM555 | National | | | |
| U 12 | LM1134 | National | | | |

Above are typical values for the capac/voltage converter circuit.

Although a particular embodiment has been described, this was for the purpose of illustrating, but not limiting, the invention. Various modifications, which will come readily to the mind of one skilled in the art, are within the scope of the invention, as defined in the appended claims.

I claim:

1. A capacitance to voltage conversion circuit for converting changes in capacitance of a capacitive bridge-type probe to voltage, the probe having a bridge with a sensitive arm and excitation means for providing an excitation signal to said capacitive bridge, said excitation means having output means;

said circuit comprising:

detector means for detecting changes in said excitation signal across said sensitive arm due to changes in capacitance of said sensitive arm;

said detector means having input means and output means, the input means of said detector means being connected to said sensitive arm;

variable gain amplifier means having signal input means, gain control input means and output means, the signal input means of said variable gain amplifier means being connected to the output means of said detector means;

reference oscillator means having output means;

first synchronous detector means having input means, output means and a clock terminal;

the output means of said variable gain amplifier means being connected to the input means of said first synchronous detector means and the output means of said refernece oscillator means being connected to the clock terminal of said first synchronous detector means;

comparator means having first input means and second input means and output means;

a source of reference voltage having output means;

the first input means of said comparator means being connected to the output means of said synchronous detector means;

the second input means of said comparator means being connected to the output means of said source of reference voltage;

the output means of said comparator means being connected to the gain control means of said variable gain amplifier means;

offset means for providing a predetermined imbalance to said bridge;

means for switching said offset means in circuit in said sensitive arm, said means for switching having a control terminal;

the output means of said reference oscillator means being connected to said control terminal of said means for switching;

whereby, when said offset means is in circuit, said first synchronous detector means is clocked, so that the output of the variable gain amplifier due to the offset is compared, in the comparator means, with the output of said source of reference voltage, and the gain of the variable gain amplifier means is controlled to drive the output of said first synchronous detector means to be equal to the output of said source of reference voltage.

2. A circuit as defined in claim 1 wherein said detector means comprises a differentiating amplifier having input means connected to said sensitive arm and output means and a second synchronous detector having input means and output means;

the output means of said differentiating amplifier being connected to the input means of said second synchronous detector;

first filter means having input means and output means;

the output means of said second synchronous detector being connected to the input means of said first filter means;

the output means of said first filter means being connected to the input means of said variable gain amplifier means.

3. A circuit as defined in claim 2 and including phase equalizer means having an input means and an output means;

the input means of said phase equalizer means being connected to the output means of said excitation means;

the output means of said phase excitation means being connected to the input means of said second synchronous detector.

4. A circuit as defined in claim 3 wherein said variable gain amplifier means comprises a voltage variable gain stage.

5. A circuit as defined in claim 4 wherein said offset means comprises a bank of capacitors connected in series with a diode across the sensitive arm of said probe;

whereby, output from said reference oscillator means will switch said capcitor bank into and out of circuit across said sensitive arm.

6. A circuit as defined in claim 5 and further including variable capacitor means connected in circuit across one of the fixed arms of said probe, said variable capacitor means having a control terminal;

zero integrator means having an input means and an output means, the output means of said zero integrator means being connected to the control terminal of said variable capacitor means;

the output means of said second synchronous detector being connected to the input means of said zero integrator means.

7. A circuit as defined in claim 6 and further including second filter means having an input means and an output means;

the second filter means being connected in circuit between said second synchronous detector and said zero integrator means;

whereby, the bridge of said probe is automatically balanced.

* * * * *

UNITED STATES PATENT AND TRADEMARK OFFICE
CERTIFICATE OF CORRECTION

PATENT NO. : 4,795,965
DATED : January 3, 1989
INVENTOR(S) : Kevin A. DOOLEY

It is certified that error appears in the above-identified patent and that said Letters Patent is hereby corrected as shown below:

Column 1, line 42, "top" should read --tip--.
Column 3, line 37, "turine" should read --turbine--.
Column 5, line 6, "shaft" should read --shift--.
Column 5, line 66, "phase" should read --stage--.
Column 8, line 18, "refernece" should read --reference--.
Column 8, line 51, "differentiating" should read --differential--.
Column 8, line 55, "differentiating" should read --differential--.

Signed and Sealed this

Twenty-sixth Day of September, 1989

*Attest:*

DONALD J. QUIGG

*Attesting Officer*     *Commissioner of Patents and Trademarks*